US010820094B2

(12) United States Patent
Park et al.

(10) Patent No.: US 10,820,094 B2
(45) Date of Patent: Oct. 27, 2020

(54) WATERPROOF ELECTRONIC DEVICE

(71) Applicant: Samsung Electronics Co., Ltd., Gyeonggi-do (KR)

(72) Inventors: Sukchul Park, Seoul (KR); Yuchul Chang, Gyeonggi-do (KR); Kwanghwan Kim, Gyeonggi-do (KR); Jinchoul Park, Gyeonggi-do (KR); Seungjoon Lee, Seoul (KR); Jingyu Choi, Gyeonggi-do (KR); Minwoo Yoo, Gyeonggi-do (KR); Byounguk Yoon, Gyeonggi-do (KR); Jongchul Choi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/658,011

(22) Filed: Jul. 24, 2017

(65) Prior Publication Data
US 2018/0035204 A1    Feb. 1, 2018

(30) Foreign Application Priority Data
Jul. 29, 2016 (KR) .................. 10-2016-0097561

(51) Int. Cl.
*H04R 25/00* (2006.01)
*H04R 1/44* (2006.01)
(Continued)

(52) U.S. Cl.
CPC ............... *H04R 1/44* (2013.01); *B29C 48/00* (2019.02); *G06F 1/1656* (2013.01); *H04M 1/03* (2013.01);
(Continued)

(58) Field of Classification Search
CPC . H04R 1/44; H04R 1/00; H04R 1/025; H04R 2499/11; B82Y 30/00; G06F 1/1656; B29C 49/0808
(Continued)

(56) References Cited

U.S. PATENT DOCUMENTS 6,512,834 B1    1/2003  Banter et al.
9,710,017 B2 *  7/2017  McClure ............... G06F 1/1626
(Continued)

FOREIGN PATENT DOCUMENTS

CN    102100083    6/2011
CN    102646730    8/2012
(Continued)

OTHER PUBLICATIONS

European Search Report dated Nov. 28, 2017 issued in counterpart application No. 17181025.2-1914, 8 pages.
(Continued)

*Primary Examiner* — Phylesha Dabney
(74) *Attorney, Agent, or Firm* — The Farrell Law Firm, P.C.

(57) ABSTRACT

An electronic device is provided which includes a housing an opening in a portion of the housing, an audio component within the housing and connected to the opening, and a membrane structure disposed to prevent a liquid from entering the audio component from outside of the housing, wherein the membrane structure includes a first adhesive layer, a second adhesive layer, and a membrane layer including a central area and a peripheral area around the central area, wherein the first adhesive layer and the second adhesive layer have a closed curve form, the peripheral area is disposed between the first adhesive layer and the second adhesive layer, the central area is coated with a plurality of particles, and at least a portion of the peripheral area
(Continued)

contacts at least one of the first adhesive layer and the second adhesive layer.

3 Claims, 18 Drawing Sheets

(51) Int. Cl.
| | | |
|---|---|---|
| G06F 1/16 | (2006.01) | |
| H04M 1/03 | (2006.01) | |
| H04M 1/18 | (2006.01) | |
| B29C 48/00 | (2019.01) | |
| H04R 1/02 | (2006.01) | |
| H05K 5/06 | (2006.01) | |
| H04M 1/02 | (2006.01) | |
| B82Y 30/00 | (2011.01) | |
| B29C 48/25 | (2019.01) | |

(52) U.S. Cl.
CPC .............. *H04M 1/18* (2013.01); *H04R 1/025* (2013.01); *H05K 5/068* (2013.01); *B29C 48/254* (2019.02); *B82Y 30/00* (2013.01); *H04M 1/02* (2013.01); *H04R 2499/11* (2013.01)

(58) Field of Classification Search
USPC .................................................. 381/386, 189
See application file for complete search history.

(56) References Cited

U.S. PATENT DOCUMENTS

| 10,258,934 | B2 | 4/2019 | Mori et al. |
| 2010/0279066 | A1 | 11/2010 | Bulliard et al. |
| 2011/0117304 | A1 | 5/2011 | Uekl et al. |
| 2011/0297578 | A1* | 12/2011 | Stiehl .................. B29C 45/1676 206/701 |
| 2016/0037243 | A1 | 2/2016 | Lippert et al. |
| 2016/0228826 | A1 | 8/2016 | Furuuchi |
| 2017/0157573 | A1 | 6/2017 | Mori et al. |
| 2018/0035204 | A1 | 2/2018 | Park et al. |

FOREIGN PATENT DOCUMENTS

| CN | 102806742 | 12/2012 |
| CN | 102888184 | 1/2013 |
| CN | 203050046 | 7/2013 |
| CN | 203225973 | 10/2013 |
| CN | 103825980 | 5/2014 |
| CN | 204442697 | 7/2015 |
| EP | 1 197 119 | 4/2002 |
| EP | 3 276 445 | 12/2018 |
| WO | WO 01/03468 | 1/2001 |
| WO | WO 2015/064028 | 5/2015 |
| WO | WO 2016/009583 | 1/2016 |

OTHER PUBLICATIONS

Chinese Office Action dated Mar. 27, 2020 issued in counterpart application No. 201710549244.9, 13 pages.

* cited by examiner

FIG. 8B
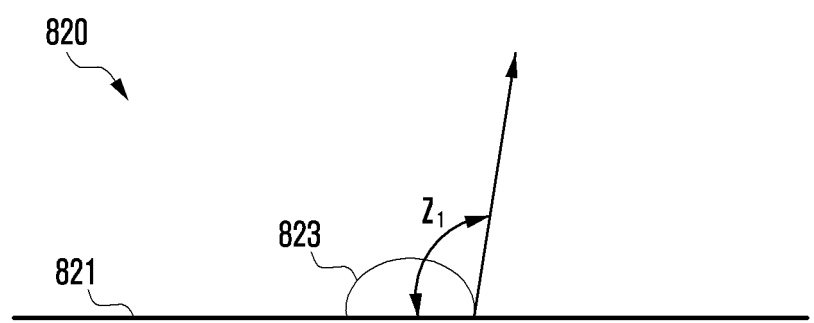
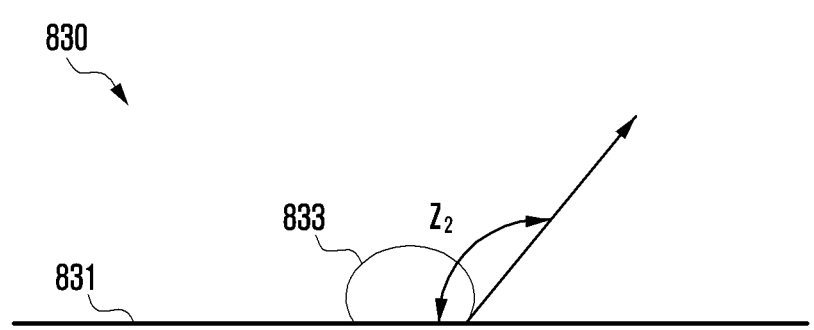

WATERPROOF ELECTRONIC DEVICE

PRIORITY

This application claims priority under 35 U.S.C. § 119(a) to Korean Patent Application Serial No. 10-2016-0097561, which was filed on Jul. 29, 2016 in the Korean Intellectual Property Office, the entire contents of which is incorporated herein by reference.

BACKGROUND

1. Field of the Disclosure

The present disclosure generally relates to an electronic device, and more particularly, to an electronic device having a structure that may block a liquid from entering a housing of the electronic device.

2. Description of the Related Art

Electronic devices such as a smart phone, tablet personal computer (PC), portable multimedia player (PMP), personal digital assistant (PDA), laptop PC, and wearable devices such as a wrist watch and a head-mounted display (HMD) may provide other functions (e.g., social network service (SNS), Internet surfing, multimedia reproduction, still picture and moving picture photographing and reproduction, and virtual assistant service) as well as a phone function.

Accordingly, users frequently carry the electronic device in their daily life and use the electronic device regardless of time and location. While users enjoy water leisure sports or winter leisure sports, the electronic device should perform various functions even in an environment that may be damaged by water, and when the electronic device is submerged in water, technology for safely protecting the electronic device is required. Therefore, in order to prevent the electronic device from being damaged when submerged, technology is required for waterproofing the electronic device.

SUMMARY

The present disclosure has been made in view of the above problem and provides an electronic device with a structure that may block a liquid from entering the housing of the electronic device and that may enhance a sound quality of a speaker.

In accordance with an aspect of the present disclosure, an electronic device is provided which includes a housing, an opening in a portion of the housing, an audio component within the housing and connected to the opening portion, and a membrane structure disposed to prevent a liquid from entering the audio component from outside of the housing, wherein the membrane structure includes a first adhesive layer, a second adhesive layer, and a membrane layer including a central area and a peripheral area around the central area, wherein the first adhesive layer and the second adhesive layer have a closed curve form, the peripheral area is disposed between the first adhesive layer and the second adhesive layer, the central area is coated with a plurality of particles, and at least a portion of the peripheral area contacts at least one of the first adhesive layer and the second adhesive layer.

BRIEF DESCRIPTION OF THE DRAWINGS

The objects, features, and advantages of the present disclosure will be more apparent from the following detailed description taken in conjunction with the accompanying drawings, in which:

FIGS. 8A and 8B illustrate a characteristic of an electronic device, according to an embodiment of the present disclosure;

DETAILED DESCRIPTION

Figure 1:
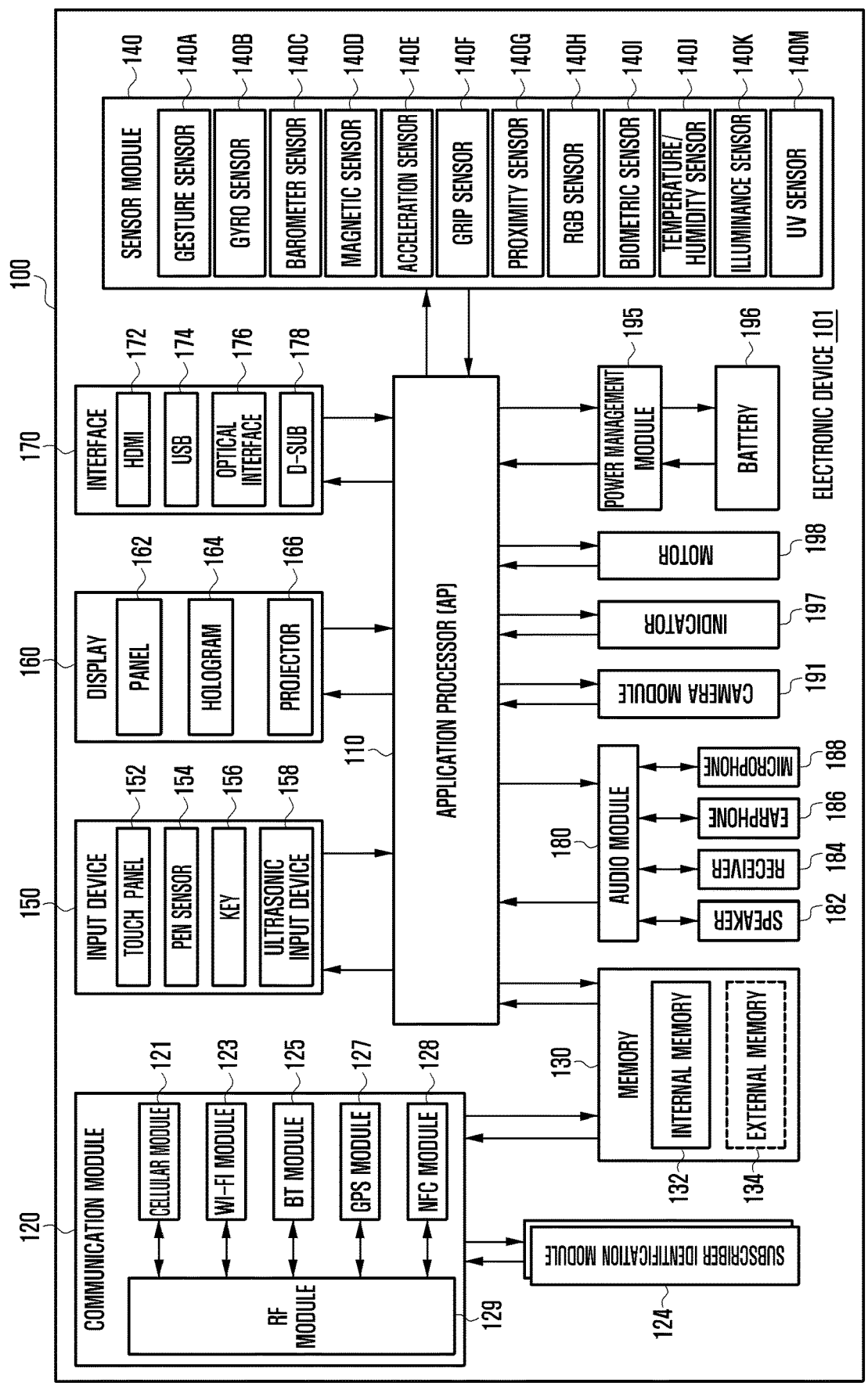
FIG. 1 is a block diagram of an electronic device, according to an embodiment of the present disclosure.

Hereinafter, certain embodiments of the present disclosure are described in detail with reference to the accompanying drawings. While the present disclosure may be embodied in many different forms, certain embodiments of the present disclosure are shown in the drawings and are described herein in detail, with the understanding that the present disclosure is not intended to limit the disclosure to the specific embodiments illustrated. The same reference numbers are used throughout the drawings to refer to the same or like parts.

The expressions "comprising" or "may comprise" as used in the present disclosure indicate the presence of a corresponding function, operation, or element and do not limit at least one additional function, operation, or element. Further, in the present disclosure, a terms "comprise" or "have" indicate the presence of a characteristic, numeral, step, operation, element, component, or combination thereof and do not exclude the presence or addition of at least one other characteristic, numeral, step, operation, element, component, or combination thereof.

In the present disclosure, the expression "or" includes any combination or the entire combination of together listed words. For example, "A or B" may include A, B, or A and B.

The expressions "first' and "second" in the present disclosure may represent various elements of the present disclosure, but do not limit the corresponding elements. These expressions do not limit the order and/or importance of the corresponding elements, and may be used for distinguishing one element from another element. Both a first user device and a second user device are both user devices and may represent different user devices. A first element may be referred to as a second element without deviating from the scope of the present disclosure, and similarly, a second element may be referred to as a first element.

When it is described that an element is "coupled" to another element, the element may be "directly coupled" to the other element or "electrically coupled" to the other element through a third element. However, when it is described that an element is "directly coupled" to another element, no additional element may exist between the element and the other element.

Terms used in the present disclosure do not limit the present disclosure but are used to illustrate certain embodiments. When used in the present disclosure and the appended claims, a singular form includes a plurality of forms unless it is explicitly represented differently.

Unless differently defined, terms including technical terms and scientific terms have the same meaning that may be generally understood by a person of ordinary skill in the art. Such terms as those defined in a generally used dictionary may be interpreted to have the same meanings as the contextual meanings in the relevant field of art and are not to be interpreted to have ideal or excessively formal meanings unless explicitly defined.

In the present disclosure, an electronic device may be a device that includes a communication function. An electronic device may be a smart phone, a tablet personal computer (PC), a mobile phone, a video phone, an e-book reader, a desktop PC, a laptop PC, a netbook computer, a personal digital assistant (PDA), a portable multimedia player (PMP), an MP3 player, a portable medical device, a digital camera, or a wearable device such as electronic glasses, a head-mounted device (HMD), electronic clothes, an electronic bracelet, an electronic necklace, an electronic appcessory, or a smart watch.

According to an embodiment of the present disclosure, an electronic device may be a smart home appliance that includes a communication function. An electronic device may be a TV, a digital video disk (DVD) player, audio equipment, a refrigerator, an air conditioner, a vacuum cleaner, an oven, a microwave, a washing machine, an air cleaner, a set-top box, a TV box (e.g., Samsung HomeSync™, Apple TV™, Google TV™, etc.), a game console, an electronic dictionary, an electronic key, a camcorder, or an electronic picture frame.

According to an embodiment of the present disclosure, an electronic device may be a medical device (e.g., magnetic resonance angiography (MRA), magnetic resonance imaging (MRI), computed tomography (CT), ultrasonography, etc.), a navigation device, a global positioning system (GPS) receiver, an event data recorder (EDR), a flight data recorder (FDR), a car infotainment device, electronic equipment for a ship (e.g., a marine navigation system, a gyrocompass, etc.), avionics, security equipment, or an industrial or home robot.

According to an embodiment of the present disclosure, an electronic device may be furniture or part of a building or construction having a communication function, an electronic board, an electronic signature receiving device, a projector, or various measuring instruments (e.g., a water meter, an electric meter, a gas meter, a wave meter, etc.). An electronic device as disclosed herein may be one of the above-mentioned devices or any combination thereof. As well understood by those skilled in the art, the above-mentioned electronic devices are not to be considered a limitation of the present disclosure.

FIG. 1 is a block diagram illustrating an electronic device, according to an embodiment of the present disclosure.

Referring to FIG. 1, the electronic device 101 includes at least one application processor (AP) 110, a communication module 120, a subscriber identification module (SIM) card 124, a memory 130, a sensor module 140, an input device 150, a display 160, an interface 170, an audio module 180, a camera module 191, a power management module 195, a battery 196, an indicator 197, and a motor 198.

The AP 110 may drive an operating system or applications, control a plurality of hardware or software components connected thereto, and also perform processing and operations on various data including multimedia data. The AP 110 may be formed of a system-on-chip (SoC), for example. According to an embodiment of the present disclosure, the AP 110 may further include a graphic processing unit (GPU).

The communication module 120 may perform data communication with an electronic device connected to the electronic device 100 through a network. According to an embodiment of the present disclosure, the communication module 120 includes a cellular module 121, a wireless fidelity (Wi-Fi) module 323, a Bluetooth™ (BT) module 125, a GPS module 127, a near field communication (NFC) module 128, and a radio frequency (RF) module 129.

The cellular module 121 may offer a voice call, a video call, a message service, an internet service, and the like through a communication network (e.g., long term evolution (LTE), LTE-advanced (LTE-A), code division multiple access (CDMA), wideband CDMA (WCDMA), universal mobile telecommunications system (UMTS), wireless broadband (Wi-Bro), global system for mobile communications (GSM), etc.). Additionally, the cellular module 121 may perform identification and authentication of the electronic device in the communication network, using the SIM card 124. According to an embodiment of the present disclosure, the cellular module 121 may perform at least part of functions the AP 110 may provide. The cellular module 121 may perform at least part of a multimedia control function.

According to an embodiment of the present disclosure, the cellular module 121 may include a communication processor (CP). Additionally, the cellular module 121 may be formed of an SoC, for example. Although some elements such as the cellular module 121, the memory 130, or the power management module 195 are shown as separate elements different from the AP 110 in FIG. 1, the AP 110 may be formed to have at least part (e.g., the cellular module 121) of the above elements.

According to an embodiment of the present disclosure, the AP 110 or the cellular module 121 may load commands or data, received from a nonvolatile memory connected thereto or from at least one of the other elements, into a volatile memory to process them. Additionally, the AP 110 or the cellular module 121 may store data, received from or created at one or more of the other elements, in the non-volatile memory.

Each of the Wi-Fi module 123, the BT module 125, the GPS module 127 and the NFC module 128 may include a processor for processing data transmitted or received therethrough. Although FIG. 1 shows the cellular module 121, the Wi-Fi module 123, the BT module 125, the GPS module 127 and the NFC module 128 as different blocks, at least part of them may be contained in a single integrated circuit (IC) chip or a single IC package. At least part (e.g., the CP corresponding to the cellular module 121 and a Wi-Fi processor corresponding to the Wi-Fi module 123) of respective processors corresponding to the cellular module 121, the Wi-Fi module 123, the BT module 125, the GPS module 127 and the NFC module 128 may be formed as a single SoC.

The RF module 129 may transmit and receive data, e.g., RF signals or any other electric signals. The RF module 129 may include a transceiver, a power amp module (PAM), a frequency filter, a low noise amplifier (LNA), and the like. The RF module 129 may include a component, e.g., a wire or a conductor, for transmission of electromagnetic waves over the air. Although FIG. 1 shows that the cellular module 121, the Wi-Fi module 123, the BT module 125, the GPS module 127 and the NFC module 128 share the RF module 129, at least one of them may perform transmission and reception of RF signals through a separate RF module.

The SIM card 124 may be inserted into a slot in the electronic device 101. The SIM card 124 may contain therein an integrated circuit card identifier (ICCID) or an international mobile subscriber identity (IMSI).

The memory 130 includes an internal memory 132 and an external memory 134. The internal memory 132 may include, for example, at least one of a volatile memory, e.g., dynamic random access memory (DRAM), static RAM (SRAM), synchronous dynamic RAM (SDRAM), and the like, and non-volatile memory, e.g., one time programmable read only memory (OTPROM), programmable ROM (PROM), erasable and programmable ROM (EPROM), electrically erasable and programmable ROM (EEPROM), mask ROM, flash ROM, NAND flash memory, NOR flash memory, etc.

According to an embodiment of the present disclosure, the internal memory 132 may have the form of a solid state drive (SSD). The external memory 134 may include a flash drive, e.g., compact flash (CF), secure digital (SD), micro-SD, mini-SD, extreme digital (XD), a memory stick, and the like. The external memory 134 may be functionally connected to the electronic device 101 through various interfaces. The electronic device 101 may further include a storage device or medium such as a hard drive.

The sensor module 140 may measure a physical quantity or sense an operating status of the electronic device 101, and then convert measured or sensed information into electric signals. The sensor module 140 includes, for example, at least one of a gesture sensor 140A, a gyro sensor 140B, an atmospheric sensor 140C, a magnetic sensor 140D, an acceleration sensor 140E, a grip sensor 140F, a proximity sensor 140G, a color sensor 140H (e.g., red, green, blue (RGB) sensor), a biometric sensor 140I, a temperature-humidity sensor 140J, an illumination sensor 140K, and an ultraviolet (UV) sensor 140M. Additionally or alternatively, the sensor module 140 may include, e.g., an E-nose sensor, an electromyography (EMG) sensor, an electroencephalogram (EEG) sensor, an electrocardiogram (ECG) sensor, an infrared (IR), an iris scan sensor, or a fingerprint sensor. Also, the sensor module 140 may include a control circuit for controlling one or more sensors equipped therein.

The input device 150 includes a touch panel 152, a digital pen sensor 154, a key 156, and an ultrasonic input unit 158. The touch panel 152 may recognize a touch input in a manner of capacitive type, resistive type, infrared type, or ultrasonic type. Also, the touch panel 152 may further include a control circuit. In the case of a capacitive type, a physical contact or proximity may be recognized. The touch panel 152 may further include a tactile layer. In this case, the touch panel 152 may offer a tactile feedback to a user.

The digital pen sensor 154 may be formed in the same or similar manner as receiving a touch input or by using a separate recognition sheet. The key 156 may include, for example, a physical button, an optical key, or a keypad. The ultrasonic input device 158 is capable of identifying data by sensing sound waves with a microphone 188 in the electronic device 101 through an input tool that generates ultrasonic signals, thus allowing wireless recognition. According to an embodiment of the present disclosure, the electronic device 101 may receive a user input from an external device (e.g., a computer or a server) connected thereto through the communication module 120.

The display 160 includes a panel 162, a hologram 164, and a projector 166. The panel 162 may be, for example, a liquid crystal display (LCD), an active matrix organic light emitting diode (AM-OLED) display, and the like. The panel 162 may have a flexible, transparent or wearable form. The panel 162 may be formed of a single module with the touch panel 152. The hologram 164 may show a stereoscopic image in the air using interference of light. The projector 166 may project an image onto a screen, which may be located inside or outside of the electronic device 101. According to an embodiment of the present disclosure, the display 160 may further include a control circuit for controlling the panel 162, the hologram 164, and the projector 166.

The interface 170 may include, for example, a high-definition multimedia interface (HDMI) 172, a universal serial Bus (USB) 174, an optical interface 176, or a D-sub-miniature (D-sub) 178. The interface 170 may be contained, for example, in the communication interface 160 shown in FIG. 1. Additionally or alternatively, the interface 170 may include, for example, a mobile high-definition link (MHL) interface, a secure digital (SD) card/multi-media card (MMC) interface, or an infrared data association (IrDA) interface.

The audio module 180 may perform a conversion between sound and electric signals. The audio module 180 may process sound through a speaker 182, a receiver 184, an earphone 186, or a microphone 188.

The camera module 191 is a device capable of obtaining still images and moving images. According to an embodiment of the present disclosure, the camera module 191 may include at least one image sensor (e.g., a front sensor or a rear sensor), a lens, an image signal processor (ISP), or a flash (e.g., LED or xenon lamp).

The power management module 195 may manage electric power of the electronic device 101. The power management module 195 may include, for example, a power management integrated circuit (PMIC), a charger IC, or a battery gauge.

The PMIC may be formed, for example, of an IC chip or SoC. Charging may be performed in a wired or wireless manner. The charger IC may charge a battery 196 and prevent overvoltage or overcurrent from a charger. According to an embodiment of the present disclosure, the charger IC may have at least one of wired and wireless charging types. A wireless charging type may include, for example, a magnetic resonance type, a magnetic induction type, or an electromagnetic type. An additional circuit for a wireless charging may be further used such as a coil loop, a resonance circuit, or a rectifier.

The battery gauge may measure the residual charge amount of the battery 196 and a voltage, current or temperature in a charging process. The battery 196 may store or create electric power therein and supply electric power to the electronic device 101. The battery 196 may be, for example, a rechargeable battery or a solar battery.

The indicator 197 may show thereon a current status (e.g., a booting status, a message status, or a recharging status) of the electronic device 101 or of a part (e.g., the AP 110). The motor 198 may convert an electric signal into a mechanical vibration. The electronic device 301 may include a specific processor (e.g., GPU) for supporting a mobile TV. This processor may process media data that complies with standards of digital multimedia broadcasting (DMB), digital video broadcasting (DVB), or Mediaflo™.

Each of the above-discussed elements of the electronic device disclosed herein may be formed of one or more components, and their names may vary according to the type of electronic device. The electronic device disclosed herein may be formed of at least one of the above-discussed elements without some elements or with additional other elements. Some of the elements may be integrated into a single entity that performs the same functions as those of such elements before integration.

The term "module" as used in the present disclosure may refer to a certain unit that includes one of hardware, software and firmware or any combination thereof. The term module may be interchangeably used with the terms unit, logic, logical block, component, or circuit, for example. The module may be the minimum unit, or part thereof, which performs one or more particular functions. The module may be formed mechanically or electronically. The module disclosed herein may include at least one of application-specific integrated circuit (ASIC) chip, field-programmable gate arrays (FPGAs), and programmable-logic device, which have been known or are to be developed.

An electronic device, according to an embodiment of the present disclosure, includes a housing, an opening in a portion of the housing, an audio component within the housing and connected to the opening portion, and a membrane structure disposed to prevent a liquid from entering into an audio component of an electronic device from outside of the housing.

The membrane structure includes a first adhesive layer, second adhesive layer, and a membrane layer.

The first adhesive layer and the second adhesive layer have a closed curve form.

The membrane layer includes a central area and a peripheral area around the central area when viewed from the top.

The peripheral area is disposed between the first adhesive layer and the second adhesive layer, the central area is coated with a plurality of particles, and at least a portion of the peripheral area contacts at least one of the first adhesive layer and the second adhesive layer.

The audio component includes a speaker.

The plurality of particles have a diameter in a range of 80 nanometers to 120 nanometers.

Outermost regions of the first adhesive layer and the second adhesive layer contact each other.

The housing includes a first surface, a second surface facing in a direction opposite to that of the first surface, and a side surface that encloses a space between the first surface and the second surface, and the opening is formed at the side surface.

The membrane layer is formed in a network structure having a pitch in a range of 46 microns to 140 microns.

The peripheral area is coated with a plurality of particles of a kind different from that of the plurality of particles that coat the central area.

The plurality of particles that coat the peripheral area have a diameter greater than that of the plurality of particles that coat the central area.

The membrane layer includes a first portion facing the audio component and a second portion facing in a direction opposite from that of the first portion, and the first portion is coated with the plurality of particles.

The first portion coated with the plurality of particles has hydrophobicity, and the second portion has hydrophilicity.

The membrane structure further includes rubber disposed between the first adhesive layer and the audio component to prevent a sound output from the audio component from leaking into the electronic device.

The rubber includes a protruding portion that contacts at least a portion of the audio component to be compressed.

The rubber, the first adhesive layer, and the second adhesive layer are made of a waterproof material.

Figure 2:
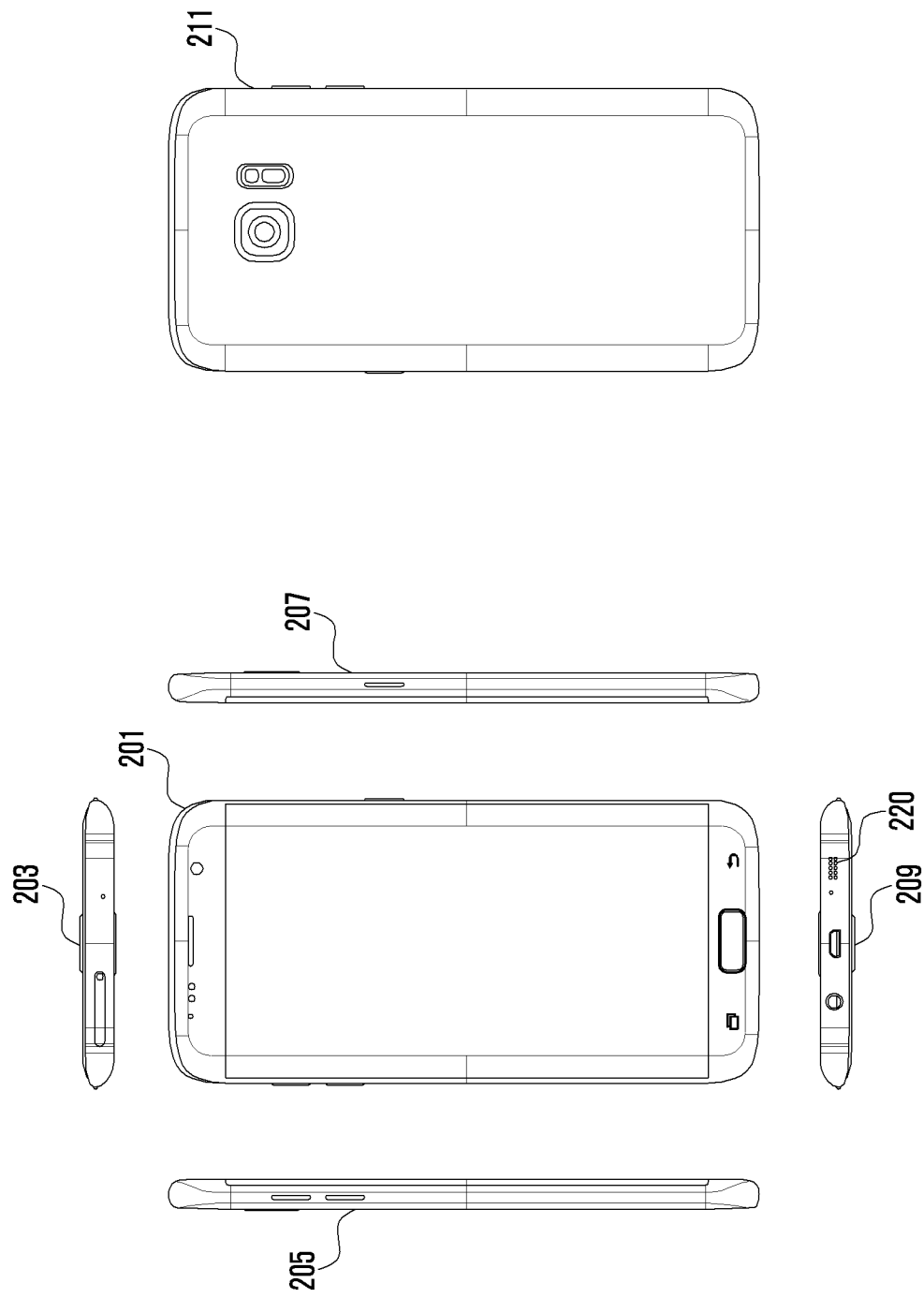
FIG. 2 is a diagram illustrating an external appearance of an electronic device, according to an embodiment of the present disclosure.

FIG. 2 is a diagram illustrating an external appearance of an electronic device, according to an embodiment of the present disclosure.

Referring to FIG. 2, a front surface 201 of the electronic device may include a display. The front surface 201 of the electronic device may include a touch screen. The front surface 201 of the electronic device may include at least one of a camera, light, home key, and soft key.

According to an embodiment of the present disclosure, each side surface 203,205, 207, and 209 of the electronic device may include a physical button, display, or touch screen. One side surface (e.g., a low side surface 209) of the electronic device may include a terminal to which an earphone is connected, a USB terminal, or a terminal to which a power cable is connected. One side surface (e.g., the low side surface 209) of the electronic device may include an opening portion 220. The opening portion 220 may be connected with an audio component (e.g., a speaker) positioned within a housing of the electronic device. A sound output from the audio component within the electronic device may be emitted to the outside of the electronic device through the opening portion 220. The opening portion 220 and the audio component may be connected through a fluid (e.g., air or liquid). A rear surface 211 of the electronic device may include a camera or light.

Figure 3:
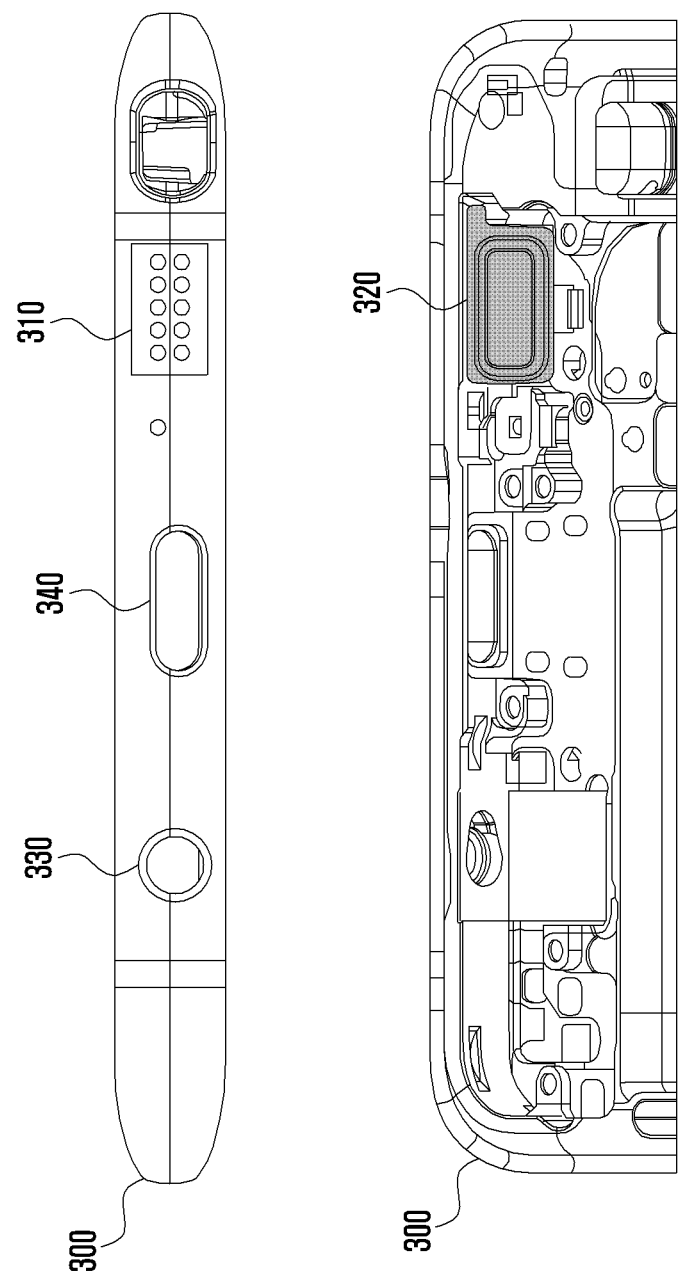
FIG. 3 is a diagram illustrating a structure of one end of an electronic device, according to an embodiment of the present disclosure.

FIG. 3 is a diagram illustrating a structure of one end of an electronic device according to an embodiment of the present disclosure.

Referring to FIG. 3, the electronic device includes an opening portion 310 at one side surface thereof. The opening portion 310 may be positioned in a direction in which a sound is emitted from an audio component (e.g., a speaker) within the electronic device. The opening portion 310 may be formed of a plurality of holes.

According to an embodiment of the present disclosure, at an inside surface (e.g., a surface toward the audio component within the electronic device) of the opening portion 310, rubber 320 may be disposed. At the inside surface of the opening portion, the rubber 320 of the audio component may be disposed. The rubber 320 may prevent a liquid from penetrating inside the housing of the electronic device. The rubber 320 may prevent a sound output from the audio component from leaking to another location (e.g., the inside of the electronic device). The rubber 320 may prevent a sound output from the audio component from leaking to an unwanted location. The rubber 320 may contact the audio component positioned within the housing of the electronic device. The rubber 320 may be connected to a portion in which a sound is output from the audio component to prevent dust or liquid from penetrating inside the audio component and to prevent a sound output from the audio component from leaking in a direction different from that of the opening portion. The rubber 320 may increase hermeticity of a sound output from the audio component. The rubber 320 may include a protruding portion that contacts the audio component. The protruding portion of the rubber 320 may contact the audio component. The rubber 320 may be connected to a membrane structure that prevents a liquid from entering the audio component. The rubber 320 may be included in the membrane structure.

According to an embodiment of the present disclosure, one side surface of the electronic device may include a terminal 330 to which an earphone is connected or a terminal 340 to which the power cable is connected.

Figure 4:
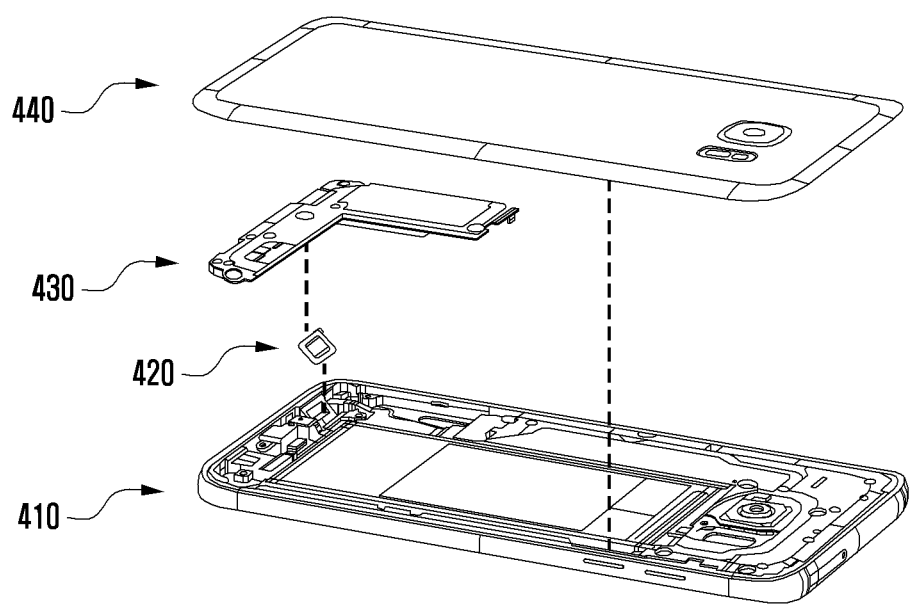
FIG. 4 is an exploded view illustrating an electronic device, according to an embodiment of the present disclosure.

FIG. 4 is an exploded view illustrating an electronic device, according to an embodiment of the present disclosure.

Referring to FIG. 4, the electronic device includes a front housing 410, rubber 420, audio component (e.g., speaker module) 430, and rear housing 440.

According to an embodiment of the present disclosure, at the front housing 410, internal components (e.g., circuit board, battery, a plurality of modules (e.g., processor, camera module)) of the electronic device may be mounted. At the front housing 410, the rubber 420 and the audio component 430 may be mounted. The rubber 420 and the audio component 430 may be coupled to be mounted at the front housing 410. The rubber 420 may be coupled to a membrane structure for preventing a liquid from entering the audio component 430. The rubber 420 may form a portion of the membrane structure. The rear housing 440 may be coupled to the front housing 410 to form an external housing of the electronic device.

Figure 5:
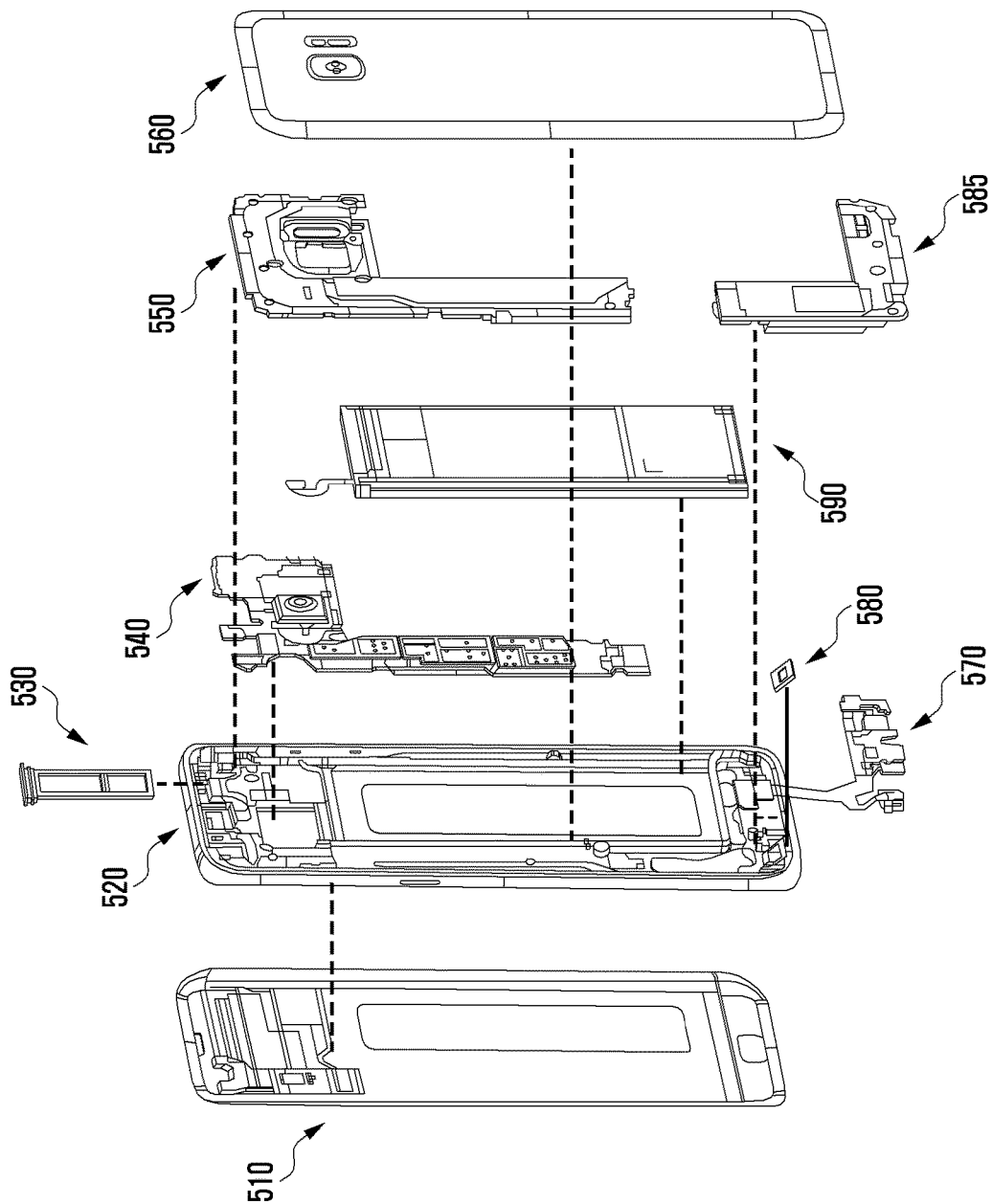
FIG. 5 is an exploded view illustrating an electronic device, according to an embodiment of the present disclosure.

FIG. 5 is an exploded view illustrating an electronic device according to an embodiment of the present disclosure. FIG. 5 illustrates in detail an exploded view of the electronic device of FIG. 4.

Referring to FIG. 5, the electronic device includes a front housing (a front assembly 510 and a front case 520), a SIM tray 530, main circuit board 540, auxiliary circuit board 550, rear housing 560, rear case, rubber 580, audio component 585, and battery 590.

The front assembly 510 may form an external appearance of the electronic device. The front assembly 510 may include a configuration of an interface (e.g., a button or a soft key) provided at a front surface of the electronic device. The front case 520 may have a structure that may mount internal components of the electronic device. The front case 520 may have a structure in which the main circuit board 540 and the auxiliary circuit board 550 may be mounted. The SIM tray 530 that may mount a SIM card may be inserted into a portion of the front case 520. A processor and various modules of the electronic device may be electrically connected to the main circuit board 540 and the auxiliary circuit board 550. The rear case may have a structure that may mount internal components of the electronic device. The front case 520 and the rear case may be coupled to fix components mounted within the electronic device. The rear housing 560 may be coupled to the front assembly 510 to form an external appearance of the electronic device.

According to an embodiment of the present disclosure, the electronic device includes an audio component 585 (e.g., speaker module) and rubber 580. The rubber 580 may contact at least a portion of the audio component 585. The rubber 580 may be disposed between the audio component 585 and the front case 520 and may be compressed by the audio component 585. The rubber 580 may be coupled to a membrane structure for preventing a liquid from entering the audio component 585. The rubber 580 may form a portion of the membrane structure.

According to an embodiment of the present disclosure, a structure and elements of the electronic device are not limited to those of FIG. 5.

Figure 6:
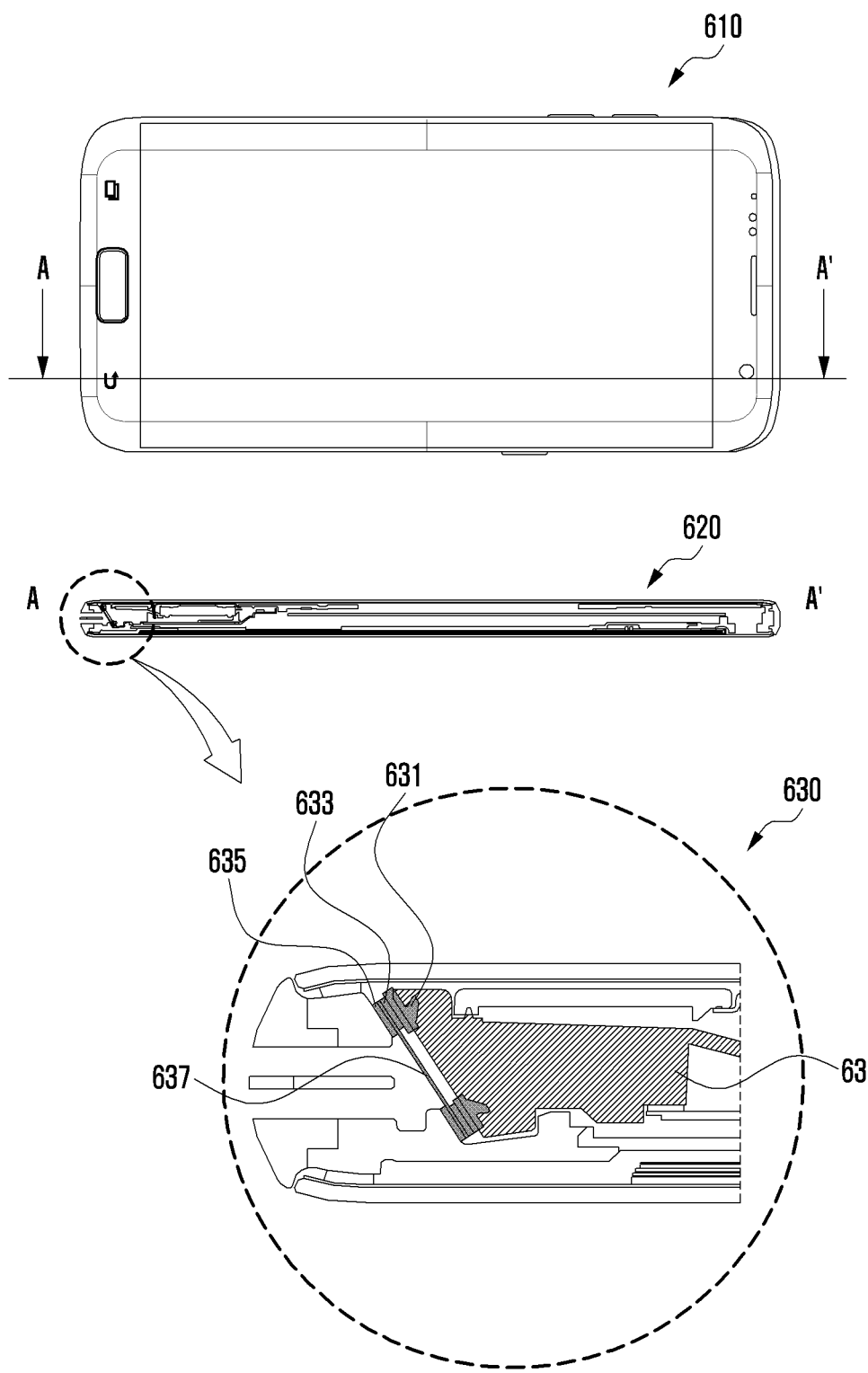
FIG. 6 is a view illustrating a cross-section of an electronic device, according to an embodiment of the present disclosure.

FIG. 6 is a view illustrating a cross-section of an electronic device, according to an embodiment of the present disclosure.

Referring to FIG. 6, a top plan view of the electronic device 610 is illustrated, 620 illustrates a cross-section taken along line A-A' in electronic device 610, and 630 illustrates an enlarged view of a portion of cross-section 620.

The electronic device may include a membrane structure and an audio component 639 (e.g., a speaker module).

According to an embodiment of the present disclosure, the membrane structure may be disposed to prevent a liquid from entering the audio component 639. The membrane structure may include a first adhesive layer 633, second adhesive layer 635, and membrane layer 637. The membrane layer 637 may include a central area and a peripheral area around the central area. The central area of the membrane layer 637 may be coated with a plurality of particles. The central area may be coated with particles having a diameter in a nanometer range. The membrane layer 637 may increase dustproof and waterproof effects through nano coating. The membrane layer 637 may be disposed between the first adhesive layer 633 and the second adhesive layer 635.

According to an embodiment of the present disclosure, the first adhesive layer 633 and the second adhesive layer 635 may have a closed curve form. The first adhesive layer 633 and the second adhesive layer 635 may have an external appearance similar to that of the membrane layer 637 and have a closed curve form in which an opening portion is formed at a central portion thereof. The first adhesive layer and the second adhesive layer may be made of a waterproof material. The first adhesive layer and the second adhesive layer may include a waterproof tape. The first adhesive layer may connect the membrane layer 637 and the audio component 639 (or rubber 631), and the second adhesive layer may connect the membrane layer 637 and a support structure of an opening portion.

According to an embodiment of the present disclosure, the electronic device may include an opening portion. The opening portion may be a passage in which a sound output from the audio component 639 is emitted to the outside of the electronic device. The membrane structure may be disposed between the opening portion of the electronic device and the audio component 639 to prevent dust or liquid including a small particle from entering the audio component 639 through the opening portion.

According to an embodiment of the present disclosure, the membrane structure may further include rubber 631. A portion of the rubber 631 may be attached to the first adhesive layer 633. The rubber 631 may include a protruding portion contacting the audio component 639. The protruding portion of the rubber 631 may be compressed by the audio component 639. The rubber 631 may be disposed between the first adhesive layer 633 and the audio component 639, and at least a portion (e.g., a protruding portion) thereof may be compressed to prevent dust or liquid from entering the audio component 639 and to prevent a sound which the audio component outputs from leaking to another location within the electronic device.

Figure 7A:
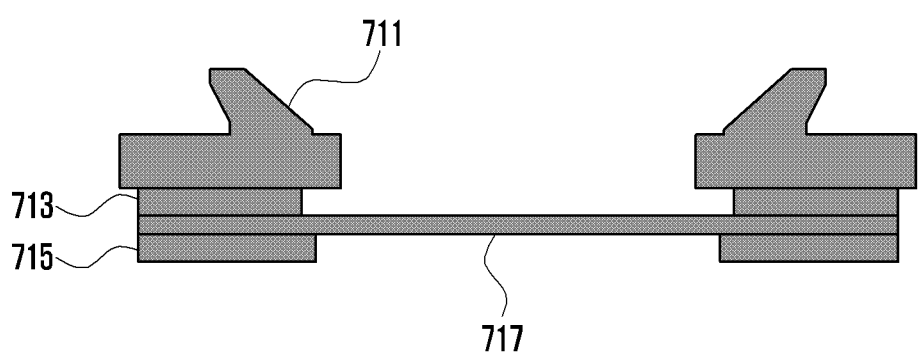
FIGS. 7A and 7B are cross-sectional views illustrating a membrane structure of an electronic device, according to an embodiment of the present disclosure.
Figure 7B:
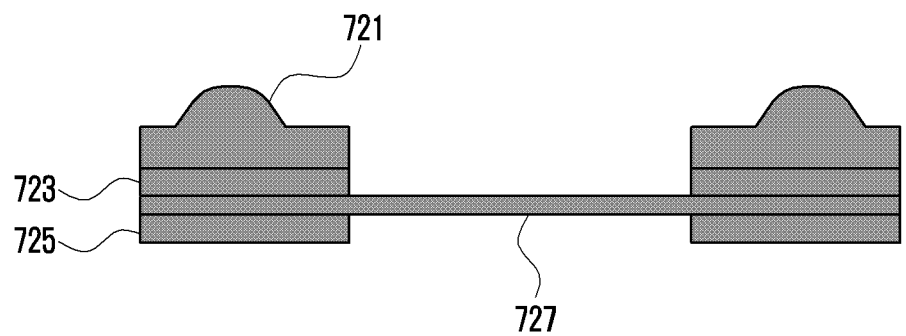

FIGS. 7A and 7B are cross-sectional views illustrating a membrane structure of an electronic device according to an embodiment of the present disclosure.

Referring to FIGS. 7A and 7B, the membrane structure includes rubber 711 and 721, first adhesive layers 713 and 723, second adhesive layers 715 and 725, and membrane layers 717 and 727.

According to an embodiment of the present disclosure, the membrane layers 717 and 727 may have a mesh structure. The membrane layers 717 and 727 may be formed in a network structure having a pitch of 46 microns to 140 microns. The membrane layers 717 and 727 may have a mesh specification of 100 to 300.

According to an embodiment of the present disclosure, the membrane layers 717 and 727 may include a central area and a peripheral area around the central area, when viewed from the top. The central area of the membrane layers 717 and 727 may be coated with a plurality of particles. The central area may be nano coated with particles having a diameter in a nanometer range. The membrane layers 717 and 727 may be coated with particles having a diameter of 80 nanometers to 120 nanometers.

According to an embodiment of the present disclosure, the entire or a partial area (e.g., the central area) of the membrane layers 717 and 727 may be nano coated. Both side surfaces of the membrane layers 717 and 727 may be nano coated. Only one side surface of the membrane layers 717 and 727 may be nano coated.

The membrane layers 717 and 727 may increase dustproof and waterproof effects through nano coating. A chemical structure of the membrane layers 717 and 727 may be compressed through nano coating and a contact angle at which a liquid (e.g., water) contacts the membrane layers 717 and 727 may increase. When nano coating is performed, nano particles (e.g., inorganic nano particles) are chemically securely coupled; as a result, dustproof and waterproof effects may increase. When nano coating is performed, nano particles may form an island-shaped single layer at a surface of the membrane layers 717 and 727, a single layer particle film, or a multiple layer particle film. The membrane layers 717 and 727 may be coated with at least one layer of nano particles.

The membrane layers 717 and 727 may be disposed between the first adhesive layers 713 and 723 and the second adhesive layers 715 and 725.

According to an embodiment of the present disclosure, portions of the rubber 711 and 721 may be attached to the first adhesive layers 713 and 723. The rubber 711 and 721 may include protruding portions that contact the audio component. The protruding portions of the rubber 711 and 721 may be compressed by the audio component. The rubber 711 and 721 may be disposed between the first adhesive layers 713 and 723 and the audio component, and at least a portion (e.g., a protruding portion) of the rubber 711 and 721 may be compressed to improve hermeticity between the membrane structure and the audio component.

According to an embodiment of the present disclosure, protruding portions of the rubber 711 and 721 may have various forms. With reference to FIG. 7A, the protruding portion may be formed in an angled shape. With reference to FIG. 7B, the protruding portion may have a convex shape. The protruding portion of the rubber 711 and 721 may be compressed between the membrane structure (e.g., the membrane layers 717 and 727 or the first adhesive layers 713 and 723) and the audio component to improve hermeticity. The rubber 711 and 721 may prevent dust or liquid from entering the audio component and prevent a sound output from the audio component from leaking to the inside of the electronic device. The protruding portion is not limited to that of FIGS. 7A and 7B and may have various forms for securing or improving hermeticity.

Figure 8A:
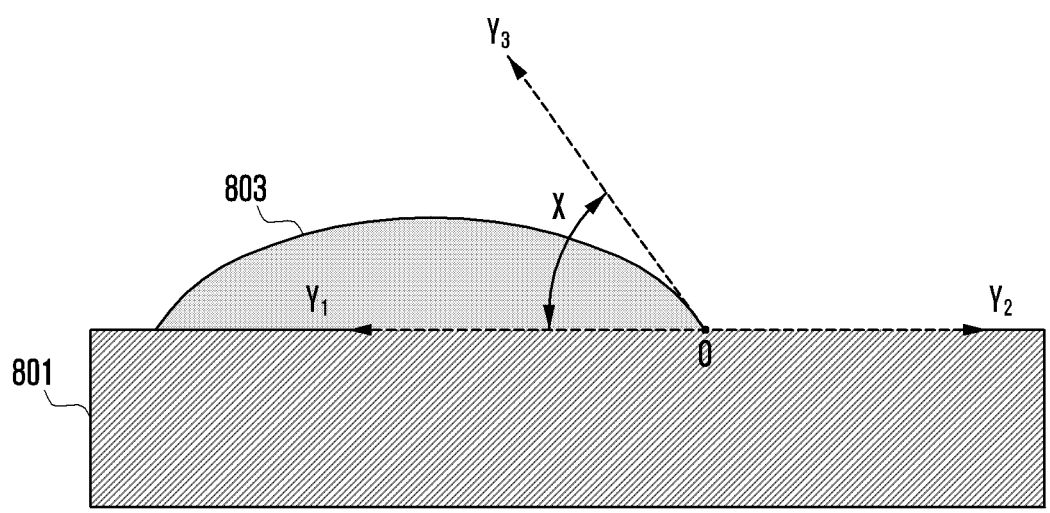

FIGS. 8A and 8B illustrate a characteristic of an electronic device according to an embodiment of the present disclosure.

FIG. 8A illustrates a contact angle of a liquid 803 to solid 801. When the liquid 803 is on a solid surface Y1 and when the liquid 803 and the solid 801 are in a relationship shown in FIG. 8A, a contact angle X is an angle of the side of the liquid 803 formed between a tangent Y3 at a contact point O of the solid 801 and the liquid 803 and a solid surface Y1. A contact angle X may be an index that determines a relationship of the liquid 803 to the solid 801. When the contact angle X increases, the liquid 803 may not be absorbed into the solid 801.

FIG. 8B illustrates a contact angle of a case using a general mesh and a case using a mesh (membrane layer) coated with nano particles, according to an embodiment of the present disclosure.

According to an embodiment of the present disclosure, the membrane layer (e.g., mesh) may have a network structure. The membrane layer may be formed in a network structure having a pitch of 46 microns to 80 microns. The membrane layer is coated with nano particles to improve dustproof and waterproof effects. The membrane layer may have a secure chemical structure through nano coating, and a contact angle may increase in which a liquid contacts the membrane layer. When nano coating is performed, chemical coupling between nano particles may be compressed, and because a gap in which other particles may penetrate decreases, it may be difficult for liquid particles to penetrate into the membrane layer. Nano coated particles may have a diameter of 80 nanometers to 120 nanometers.

Graph 820 illustrates a contact angle Z1 of a general mesh (e.g., a fabric mesh 821). That is, graph 820 illustrates a contact angle Z1 of a liquid 823 to a surface of the mesh 821 that is not coated with nano particles. Graph 830 illustrates a contact angle Z2 of a liquid 833 to a surface of a nano coated mesh 831. The fabric mesh may have a contact angle of about 96° to a liquid (e.g., water). The nano coated mesh may have a contact angle of about 81° to a liquid (e.g., water). As shown in FIG. 8B, the contact angle Z2 of the nano coated mesh 831 is greater than a contact angle Z1 of a general mesh 821; as a result, a liquid blocking effect or a waterproof effect of the nano coated mesh 831 relatively increases.

According to an embodiment of the present disclosure, because the membrane layer (e.g., mesh) is coated with particles having a diameter in a nanometer range (e.g., 80 nanometers to 120 nanometers), a contact angle may increase and a waterproof effect may increase. Because the membrane layer is nano coated, hydrophobicity or water repellency may increase.

Figure 9:
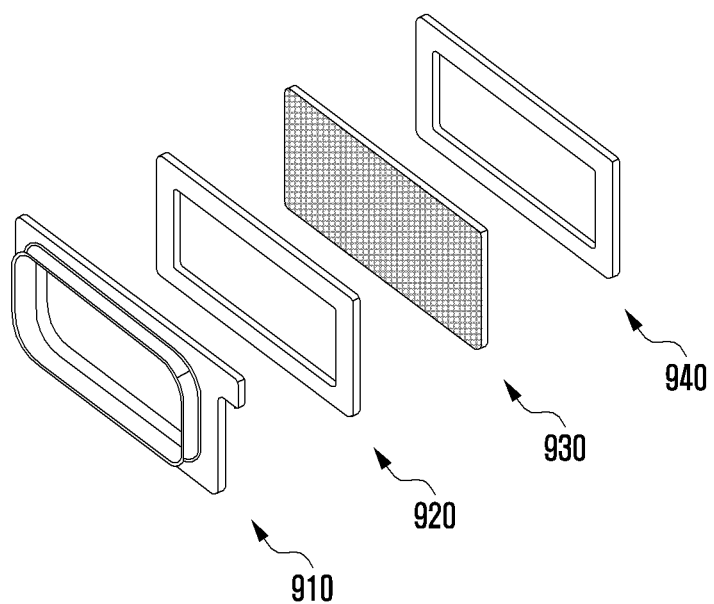
FIG. 9 is an exploded view illustrating a membrane structure of an electronic device, according to an embodiment of the present disclosure.

FIG. 9 is an exploded view illustrating a membrane structure of an electronic device, according to an embodiment of the present disclosure.

Referring to FIG. 9, the membrane structure includes rubber 910, a first adhesive layer 920, a membrane layer 930, and a second adhesive layer 940.

According to an embodiment of the present disclosure, the rubber 910 may be disposed between an audio component and the first adhesive layer 920. The rubber 910 may include a protruding portion compressed by the audio component.

According to an embodiment of the present disclosure, the first adhesive layer 920 may connect the rubber 910 and the membrane layer 930. The second adhesive layer 940 may connect the membrane layer 930 and a portion (e.g., a support structure of a periphery of an opening portion of the electronic device) of the inside of the electronic device. The first adhesive layer 920 and the second adhesive layer 940 may be made of a waterproof material. The first adhesive layer 920 and the second adhesive layer 940 may have a closed curve form. The first adhesive layer 920 and the second adhesive layer 940 may have an external appearance similar to that of the membrane layer 930 and have a closed curve form in which an opening portion is formed at a center portion thereof.

According to an embodiment of the present disclosure, the membrane layer 930 may have a mesh structure. The membrane layer 930 may be formed in a network structure having a pitch of 46 microns to 140 microns. The membrane layer 930 may have a mesh specification (e.g., the number of empty spaces included within a unit area) of 100 to 300. The membrane layer 930 may block dust or liquid from outside of the electronic device from entering the audio component.

According to an embodiment of the present disclosure, at least a portion of the membrane layer 930 may be coated with a plurality of particles. The membrane layer 930 may include a central area and a peripheral area around the central area, when viewed from the top. Only the central area of the membrane layer 930 may be coated with a plurality of particles. The central area and the peripheral area of the membrane layer 930 may be coated with different particles. The membrane layer 930 may include a first portion (or a first surface) facing the audio component and a second portion (or a second surface) of a direction opposite to that of the first portion. Only a first portion of the membrane layer 930 may be coated with a plurality of particles. The plurality of particles that coat the membrane layer 930 may have a diameter in a nanometer range. A plurality of particles that coat the membrane layer 930 may have a diameter of 80 nanometers to 120 nanometers.

The membrane layer 930 may be coated with nano particles to form a chemically secure structure. According to an embodiment of the present disclosure, the membrane layer 930 may be coated with nano particles to improve dustproof and waterproof effects. The membrane layer 930 may have a secure chemical structure through nano coating and increase a contact angle at which a liquid contacts the membrane layer. The entire or a partial area (e.g., the central area) of the membrane layer 930 may be nano coated. Both side surfaces of the membrane layer 930 may be nano coated. Only one side surface of the membrane layer 930 may be nano coated.

According to an embodiment of the present disclosure, the membrane layer 930 may have various forms such as a square, rectangle, rhombus, and triangle. Further, a mesh specification of the membrane layer 930 may vary. The first adhesive layer 920 and the second adhesive layer 940 may have a form corresponding to the membrane layer 930.

Figure 10:
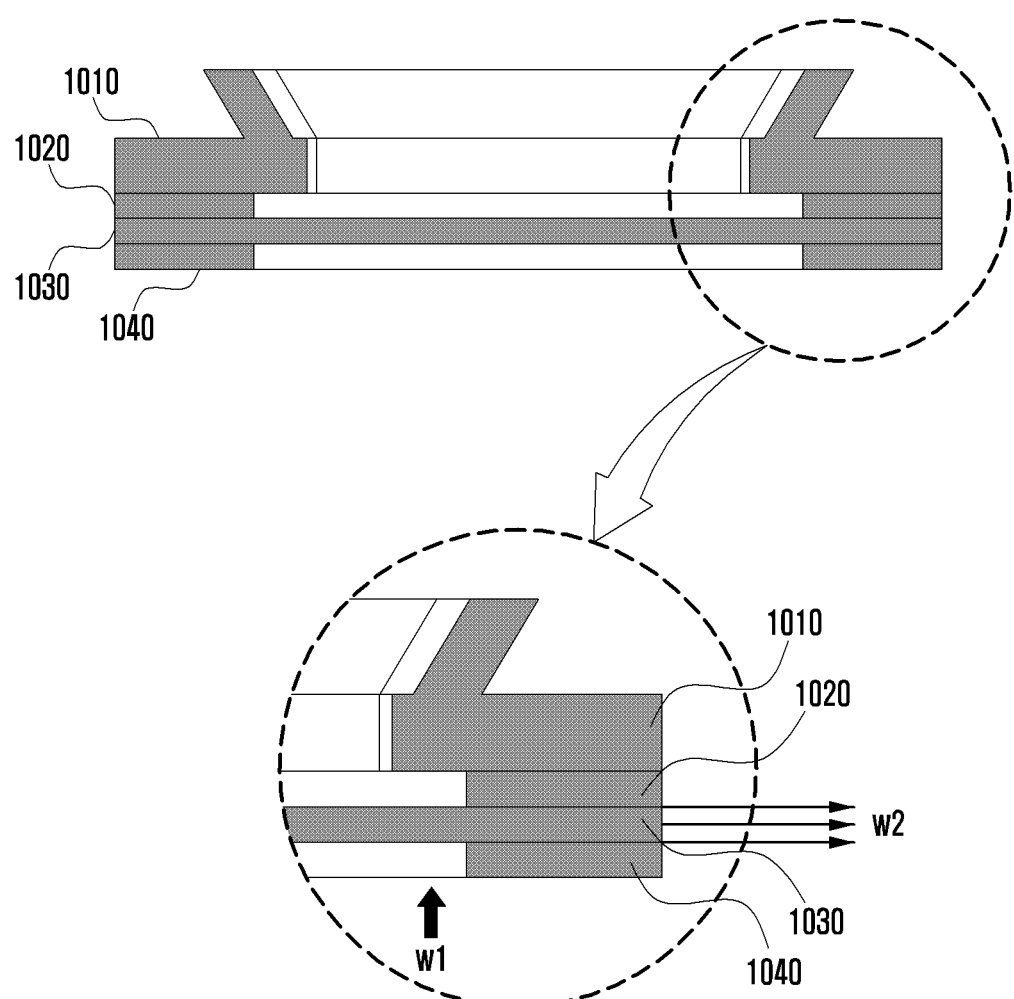
FIG. 10 illustrates a cross-section of a membrane structure of an electronic device, according to an embodiment of the present disclosure.

FIG. 10 illustrates a cross-section of a membrane structure of an electronic device, according to an embodiment of the present disclosure.

Referring to FIG. 10, the membrane structure includes rubber 1010, a first adhesive layer 1020, a second adhesive layer 1040, and a membrane layer 1030.

According to an embodiment of the present disclosure, the rubber 1010 may be disposed between an audio component and the first adhesive layer 1020 and contact the audio component and at least a portion thereof may be compressed. The first adhesive layer 1020 may attach the rubber 1010 and the membrane layer 1030. The second adhesive layer 1040 may attach the membrane layer 1030 and a portion within the electronic device. The first adhesive layer 1020 and the second adhesive layer 1040 may be a waterproof tape.

According to an embodiment of the present disclosure, the membrane layer 1030 may have a mesh structure. The membrane layer 1030 may be formed in a network structure having a pitch of 46 microns to 140 microns. The membrane layer 1030 may block dust or liquid from outside of the electronic device from entering the audio component.

According to an embodiment of the present disclosure, in order to increase dustproof or waterproof effects, at least a portion of the membrane layer 1030 may be coated with a plurality of particles. At least a portion of the membrane layer 1030 may be coated with small particles having a diameter in a nanometer range. A plurality of particles that coat the membrane layer 1030 may have a diameter of 80 nanometers to 120 nanometers. When the membrane layer 1030 is coated with nano particles, waterproof and dustproof effects of the membrane layer 1030 increase, but adhesive strength of the membrane layer 1030 and another structure (e.g., the first adhesive layer 1020 or the second adhesive layer 1040) may be deteriorated. Therefore, a liquid w1 entering from outside of the electronic device may be channeled into a gap between the membrane layer 1030 and the first adhesive layer 1020 or the second adhesive layer 1040 or may pass through a coated portion of a side surface of the membrane layer 1030 to be channeled, and a liquid w2 may penetrate into another element (e.g., audio component) within the electronic device. Only a portion (e.g., the central area of the membrane layer 1030) of the membrane layer 1030 may be coated with nano particles to improve adhesive strength of the membrane layer 1030 and the first adhesive layer 1020 and the second adhesive layer 1040. A portion (a peripheral area around the central area) of an edge of the membrane layer 1030 may be coated with different particles having good adhesive strength. Because at least portions of the first adhesive layer 1020 and the second adhesive layer 1040 are directly bonded, the membrane structure may be securely maintained. By increasing the adhesive strength between the membrane layer 1030 and the first adhesive layer 1020 or the second adhesive layer 1040 and by forming a secure structure, dustproof and waterproof effects of the electronic device may increase.

Figure 11:
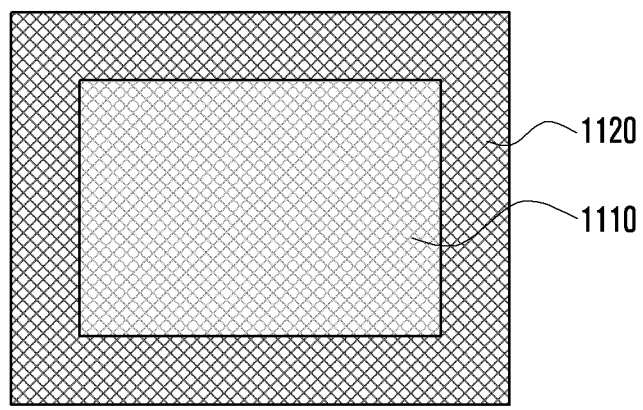
FIG. 11 is a top plan view illustrating a membrane layer of an electronic device, according to an embodiment of the present disclosure.

FIG. 11 is a top plan view illustrating a membrane layer of an electronic device, according to an embodiment of the present disclosure. FIG. 11 illustrates a membrane layer when viewed from the top.

According to an embodiment of the present disclosure, the membrane layer may have a mesh structure. The membrane layer may include a central area 1110 and a peripheral area 1120 around the central area 1110. The central area 1110 may be coated with a plurality of particles. The central area 1110 may be coated with particles having a diameter in a nanometer range. The plurality of particles may have a diameter in a range of 80 nm to 120 nm. Particles that coat the central area 1110 are not limited thereto and may include small particles having a diameter of a nanometer or less. When the membrane layer is coated nano coated with particles having a diameter of a nanometer, a chemical structure of the membrane layer is compressed and as a result, dustproof and waterproof effects may increase. When the membrane layer is nano coated, a contact angle at which a liquid forms with the membrane layer may increase. A membrane layer (e.g., fabric mesh) in which nano coating is not performed forms a contact angle smaller than that of a membrane layer in which nano coating is performed. In the membrane layer in which nano coating is performed, an area in which a liquid penetrates or contacts is maintained to be small; thus, a contact angle may further increase and a waterproof effect may increase.

When the membrane layer is nano coated, a contact force of the membrane layer may be deteriorated. According to an embodiment of the present disclosure, only the central area 1110 of the membrane layer may be nano coated. The central area 1110 of the membrane layer may increase a waterproof effect through nano coating, and the peripheral area 1120 in which nano coating is not performed may increase adhesive strength with an adhesive layer (e.g., a first adhesive layer or a second adhesive layer contacting both surfaces of the membrane layer).

According to an embodiment of the present disclosure, the central area 1110 of the membrane layer may be nano coated, and the peripheral area 1120 thereof may be coated with particles of a kind different from that of the central area 1110. The peripheral area 1120 may be coated with different particles (e.g., particles of a relatively large size or different kinds of particles having a good contact force) having a contact force greater than that of nano particles.

According to an embodiment of the present disclosure, because only a partial area of the membrane layer is coated or the membrane layer is coated with different particles on an area basis, the adhesive strength between the membrane layer and the adhesive layer increases and a secure structure is formed and the dustproof and waterproof effects of the electronic device may increase.

Figure 12A:
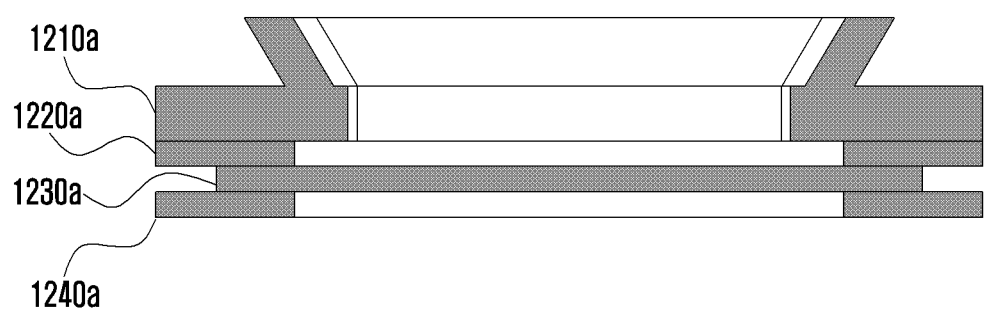
FIGS. 12A to 12C are cross-sectional views of a membrane structure of an electronic device, according to an embodiment of the present disclosure.
Figure 12B:
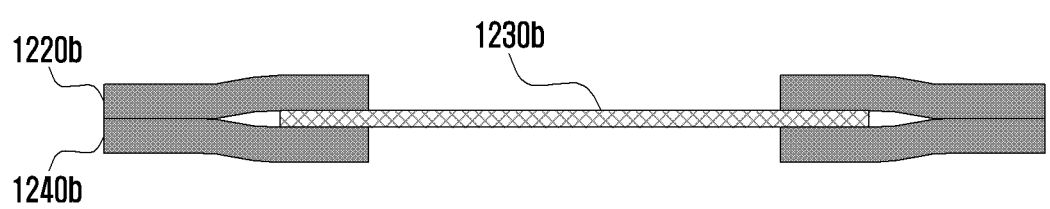
Figure 12C:
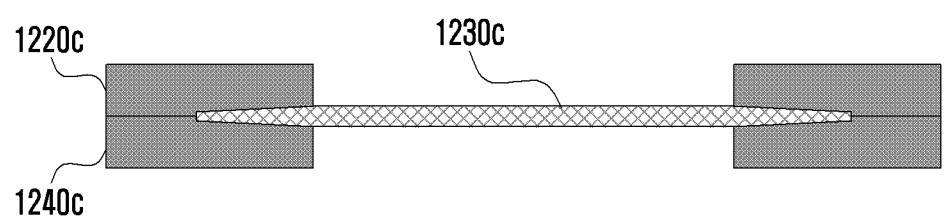

FIGS. 12A to 12C are cross-sectional views of a membrane structure of an electronic device, according to an embodiment of the present disclosure.

With reference to FIG. 12A, a membrane structure includes rubber 1210a, a first adhesive layer 1220a, a membrane layer 1230a, and a second adhesive layer 1240a.

According to an embodiment of the present disclosure, at least a portion of the rubber 1210a may contact an audio component within the electronic device to be compressed. One surface of the rubber 1210a may be attached to the membrane layer 1230a by the first adhesive layer 1220a. The rubber 1210a may be disposed between the first adhesive layer 1220a and the audio component and may be compressed by the audio component. The rubber 1210a may be compressed to prevent dust or liquid from entering the audio component and to prevent sound generated in the audio component and sound output from the audio component from leaking to another location within the electronic device.

According to an embodiment of the present disclosure, in order to increase a dustproof or waterproof effect, at least a portion of the membrane layer 1230a may be coated with a plurality of particles. At least a portion of the membrane layer 1230a may be nano coated with small particles having a diameter in a nanometer range. When the membrane layer 1230a is coated with nano particles, waterproof and dustproof effects of the membrane layer 1230a increase, but adhesive strength between the membrane layer 1230a and another structure (e.g., the first adhesive layer 1220a or the second adhesive layer 1240a) may be deteriorated.

According to an embodiment of the present disclosure, the membrane layer 1230a may be formed in an area smaller than that of the first adhesive layer 1220a or the second adhesive layer 1240a. At least a portion of an edge of the first adhesive layer 1220a and the second adhesive layer 1240a may protrude to the outside of the membrane layer 1230a. At least a portion of an edge of the membrane layer 1230a may be bonded to the first adhesive layer 1220a and the second adhesive layer 1240a. At least a portion of an edge of the first adhesive layer 1220a and the second adhesive layer 1240a directly contacts the membrane layer 1230a. Because at least portions of the first adhesive layer 1220a and the second adhesive layer 1240a are directly attached to the membrane layer 1230a, coupling to the membrane layer 1230a in which adhesive strength is deteriorated by nano coating may be securely maintained.

FIGS. 12B and 12C illustrate a case in which first adhesive layers 1220b and 1220c and second adhesive layers 1240b and 1240c directly contact each other, respectively.

With reference to FIG. 12B, the first adhesive layer 1220b and the second adhesive layer 1240b may be formed to have an area greater than that of a membrane layer 1230b. A portion of an edge of the membrane layer 1230b may bond with the first adhesive layer 1220b and the second adhesive layer 1240b. The first adhesive layer 1220b and the second adhesive layer 1240b, may have portions that deviate from a portion that contacts the membrane layer 1230b and may be directly bonded. Outermost regions of the first adhesive layer 1220b and the second adhesive layer 1240b may directly contact each other to prevent a liquid from passing through the inside and the outside of the membrane structure while supporting the membrane layer 1230b. By directly attaching portions of the first adhesive layer 1220b and the second adhesive layer 1240b having good adhesive strength, a liquid may be prevented from leaking to a side surface of the membrane structure.

With reference to FIG. 12C, the first adhesive layer 1220c and the second adhesive layer 1240c may be formed to have an area greater than that of a membrane layer 1230c. According to an embodiment of the present disclosure, the first adhesive layer 1220c and the second adhesive layer 1240c may be formed thicker than the membrane layer 1230c. The first adhesive layer 1220c and the second adhesive layer 1240c may have a thickness relatively greater than that of the membrane layer 1230c. By increasing a thickness of the first adhesive layer 1220c and the second adhesive layer 1240c and by attaching each configuration thereto, adhesive strength between the first adhesive layer 1220c and the second adhesive layer 1240c and adhesive strength between the membrane layer 1230c and the first adhesive layer 1220c and the second adhesive layer 1240c may increase. By increasing a thickness of the first adhesive layer 1220c and the second adhesive layer 1240c, the first adhesive layer 1220c, the membrane layer 1230c, and the second adhesive layer 1240c of the membrane structure within a predetermined space may be attached by a stronger pressure, and a bonding force between each may increase. A contact force between elements of the membrane structure may increase, and a liquid is blocked from leaking through the membrane structure; as a result, a waterproof effect of the electronic device may increase.

Figure 13:
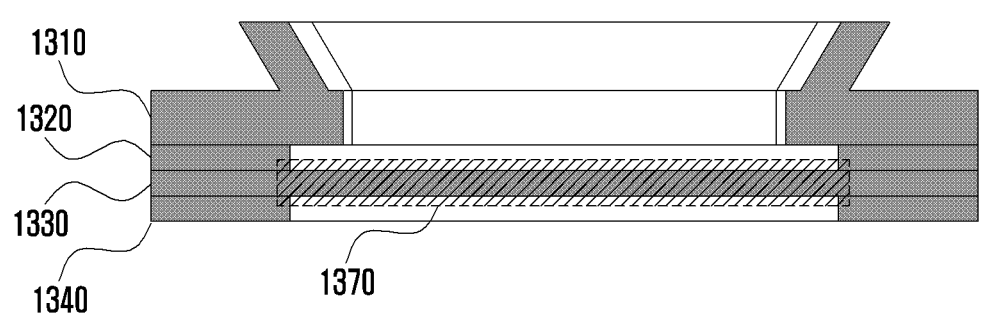
FIG. 13 illustrates a cross-section of a membrane structure of an electronic device, according to an embodiment of the present disclosure.

FIG. 13 illustrates a cross-section of a membrane structure of an electronic device, according to an embodiment of the present disclosure.

Referring to FIG. 13, the membrane structure includes rubber 1310, a first adhesive layer 1320, a membrane layer 1330, and a second adhesive layer 1340.

According to an embodiment of the present disclosure, at least a portion of the rubber 1310 may contact an audio component within the electronic device to be compressed. One surface of the rubber 1310 may be attached to the membrane layer 1330 by the first adhesive layer 1320. The rubber 1310 may be compressed between the first adhesive layer 1320 and the audio component to secure hermeticity.

According to an embodiment of the present disclosure, the membrane layer 1330 may be disposed between the first adhesive layer 1320 and the second adhesive layer 1340. A partial area 1370 of the membrane layer 1330 may be coated with a plurality of particles. The membrane layer 1330 may include a central area 1370 and a peripheral area around the central area. Only the central area 1370 of the membrane layer 1330 may be coated with a plurality of particles. The plurality of particles may be particles having a diameter in a nanometer range.

According to an embodiment of the present disclosure, the partial area 1370 (e.g., the central area) of the membrane layer 1330 may be coated with nano particles to increase a waterproof effect, and an area (e.g., a peripheral area around the central area 1370) in which nano coating is not performed may increase adhesive strength with the first adhesive layer 1320 or the second adhesive layer 1340.

According to an embodiment of the present disclosure, the central area 1370 of the membrane layer 1330 may be nano coated, and a peripheral area thereof may be coated with particles of a kind different from that of the central area 1370. The peripheral area may be coated with different particles (e.g., particles having a relatively large size or different kinds of particles having a good contact force) having a contact force greater than that of nano particles.

According to an embodiment of the present disclosure, because only a partial area 1370 of the membrane layer 1330 is coated or the membrane layer 1330 is coated with different particles on an area basis, adhesive strength between the membrane layer 1330 and the adhesive layer increases and a secure structure is formed. The dustproof and waterproof effects of the electronic device may increase as a result.

Figure 14:
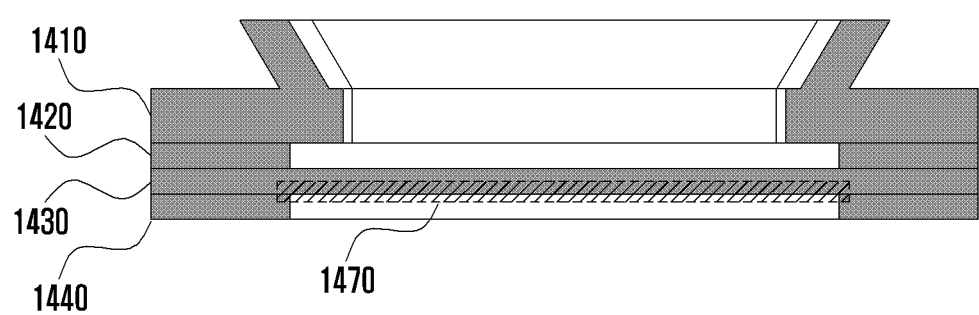
FIG. 14 illustrates a cross-section of a membrane structure of an electronic device, according to an embodiment of the present disclosure.

FIG. 14 illustrates a one cross-section of a membrane structure of an electronic device, according to an embodiment of the present disclosure.

Referring to FIG. 14, the membrane structure may include rubber 1410, a first adhesive layer 1420, membrane layer 1430, and second adhesive layer 1440.

According to an embodiment of the present disclosure, at least a portion of the rubber 1410 may contact an audio component within the electronic device. One surface of the rubber 1410 may be attached to the membrane layer 1430 by the first adhesive layer 1420. At least a portion of the rubber 1410 may be compressed between the first adhesive layer 1420 and the audio component.

According to an embodiment of the present disclosure, the membrane layer 1430 may be disposed between the first adhesive layer 1420 and the second adhesive layer 1440. A partial area of the membrane layer 1430 may be coated with a plurality of particles. The membrane layer 1430 may include a central area and a peripheral area around the central area. Only the central area of the membrane layer 1430 may be coated with a plurality of particles. The plurality of particles may have a diameter in a nanometer range. A partial area 1470 (e.g., the central area) of the membrane layer 1430 is coated with nano particles to increase a waterproof effect, and an area of the membrane layer 1430 that is not coated with nano particles may increase adhesive strength with the first adhesive layer 1420 or the second adhesive layer 1440.

According to an embodiment of the present disclosure, a portion 1470 of the membrane layer 1430 may be coated with a plurality of particles. The membrane layer 1430 may include a first portion 1470 facing a direction of the audio component (e.g., speaker module) and a second portion facing opposite to that of the first portion 1470 (e.g., a direction of an opening portion of a housing of the electronic device). The first portion 1470 of the membrane layer 1430 may be nano coated with particles having a diameter in a nanometer range. Because the first portion 1470 is nano coated, the first portion 1470 may have a property (e.g., hydrophobicity) of repelling water. A second portion of the membrane layer 1430 in which nano coated is not performed may have a property (e.g., hydrophilicity) of absorbing water. Because the first portion 1470 facing in the audio component direction is nano coated, a waterproof effect increases and a liquid may be prevented from penetrating to the audio component. Because the second portion, of the membrane layer 1430 has hydrophilicity, the second portion may absorb internal moisture that has already penetrated the inside of the electronic device or that has occurred because of dew condensation. By differently forming a property of each portion of the membrane layer 1430 and by absorbing the already penetrated moisture while blocking a liquid penetrating to the audio component, a waterproof effect may increase. Because only a partial area or a portion of the membrane layer 1430 is coated, dustproof and waterproof effects of the electronic device may increase.

The term "module" as used in the present disclosure may be a unit including a combination of at least one of, for example, hardware, software, or firmware. The term "module" may be interchangeably used with terms such as a unit, logic, a logical block, a component, or a circuit. The "module" may be a minimum unit or a portion of an integrally formed component. The "module" may be a minimum unit or a portion that performs at least one function. The "module" may be mechanically or electronically implemented. A "module", according to an embodiment of the present disclosure, may include at least one of an ASIC chip, FPGAs, or a programmable-logic device that performs operations known or to be developed.

According to an embodiment of the present disclosure, at least a portion of a method (e.g., operations) or a device (e.g., modules or functions thereof) may be implemented with instructions stored in computer-readable storage media in a form of, for example, a programming module. When the instructions are executed by at least one processor, the at least one processor may perform a function corresponding to the instructions. The computer-readable storage media may be, for example, the memory 130. At least a portion of the programming module may be implemented (e.g., executed) by, for example, the processor 120. At least a portion of the programming module may include, for example, a module, a program, a routine, sets of instructions, or a process that performs at least one function.

The computer-readable storage media may include magnetic media such as a hard disk, floppy disk, and magnetic tape, optical media such as a compact disc read only memory (CD-ROM) and a digital versatile disc (DVD), magneto-optical media such as a floptical disk, and a hardware device, specially formed to store and perform a program instruction (e.g., a programming module), such as a read only memory (ROM), a random access memory (RAM), a flash memory. Further, a program instruction may include a high-level language code that may be executed by a computer using an interpreter as well as a machine language code generated by a compiler. In order to perform operations of the present disclosure, the above-described hardware device may be formed to operate as at least one software module, and vice versa.

A module or a programming module, according to an embodiment of the present disclosure, may include at least one of the foregoing elements, may omit some elements, or may further include additional other elements. Operations performed by a module, a programming module, or another element according to the present disclosure may be executed with a sequential, parallel, repeated, or heuristic method. Further, some operations may be executed in different orders, may be omitted, or may add other operations.

An electronic device, according to an embodiment of the present disclosure, includes a waterproof structure to provide a waterproof effect.

An electronic device, according to an embodiment of the present disclosure, increases a waterproof effect through a waterproof structure coated with micro particles.

An electronic device, according to an embodiment of the present disclosure, includes a stable waterproof structure to increase a waterproof effect.

An electronic device, according to an embodiment of the present disclosure, includes a structure that prevents a liquid from penetrating into an internal component (e.g., a speaker) and maintains a stable coupling state.

Although certain embodiments of the present disclosure have been described in detail herein, it should be clearly understood that many variations and modifications of the basic inventive concepts herein described, which may appear to those skilled in the art, which fall within the spirit and scope of the embodiments of the present disclosure, as defined by the appended claims and their equivalents.

What is claimed is:

1. An electronic device, comprising:
a housing;
an opening formed in a portion of the housing;
an audio component within the housing in communication with the opening; and
a membrane structure comprising a first adhesive layer, a second adhesive layer and a membrane layer, the membrane layer comprising a first portion facing the audio component and a second portion facing in a direction opposite to that of the first portion,
wherein the first portion is coated with a plurality of hydrophobic particles and the second portion is coated with a plurality of hydrophilic particles.

2. An electronic device, comprising:
a housing;
an opening in a portion of the housing;
a first plurality of particles disposed within the housing;
a second plurality of particles disposed within the housing, with the second plurality of particles being different from the first plurality of particles;
an audio component within the housing in communication with the opening; and
a membrane structure comprising a first adhesive layer, a second adhesive layer and a membrane layer, the membrane layer comprising a central area coated with the first plurality of particles, a peripheral area surrounding at least a part of the central area, a first portion facing the audio component and a second portion facing in a direction opposite to that of the first portion,
wherein at least a portion of the peripheral area disposed between the first adhesive layer and the second adhesive layer is coated with the second plurality of particles, and
wherein the first portion is coated with a plurality of hydrophobic particles and the second portion is coated with a plurality of hydrophilic particles.

3. The electronic device of claim 2, wherein the second plurality of particles that coat the peripheral area have a diameter greater than that of the first plurality of particles that coat the central area.

* * * * *